US006466094B2

(12) United States Patent
Leighton et al.

(10) Patent No.: US 6,466,094 B2
(45) Date of Patent: Oct. 15, 2002

(54) GAIN AND BANDWIDTH ENHANCEMENT FOR RF POWER AMPLIFIER PACKAGE

(75) Inventors: Larry C. Leighton, Scottsdale; Prasanth Perugupalli, Tempe, both of AZ (US)

(73) Assignee: Ericsson Inc., Plano, TX (US)

( * ) Notice: Subject to any disclaimer, the term of this patent is extended or adjusted under 35 U.S.C. 154(b) by 0 days.

(21) Appl. No.: 09/758,629

(22) Filed: Jan. 10, 2001

(65) Prior Publication Data

US 2002/0125955 A1 Sep. 12, 2002

(51) Int. Cl.[7] .............................................. H03F 3/191
(52) U.S. Cl. ...................................... 330/302; 330/307
(58) Field of Search ................................. 330/277, 302, 330/307

(56) References Cited

U.S. PATENT DOCUMENTS

| | | | |
|---|---|---|---|
| 3,441,865 A | 4/1969 | Siwko | 330/21 |
| 4,890,069 A | * 12/1989 | Duffalo et al. | 330/302 |
| 5,315,265 A | 5/1994 | Wisherd et al. | 330/277 |
| 5,576,661 A | * 11/1996 | Kumagai | 330/277 |
| 5,942,943 A | * 8/1999 | Matsuno | 330/302 |
| 5,973,567 A | * 10/1999 | Heal et al. | 330/277 |
| 6,121,840 A | * 9/2000 | Sakusabe | 330/277 |

* cited by examiner

*Primary Examiner*—Robert Pascal
*Assistant Examiner*—Khanh Van Nguyen

(57) ABSTRACT

Gain and bandwidth enhancement of a RF power amplifier package is effected by electrically coupling a power transistor to a RF signal source with an inductance, and further electrically coupling the input and common element terminals of the power transistor with a shunt inductance. The shunt inductance is chosen such that its reactance is the conjugate of the reactance of the power transistor's common-input capacitance. A similar conjugate matching output circuit is provided to electrically couple the transistor's output and common element terminals to a load. The shunt inductors are implemented on the package substrate by connecting the respective input and output transistor terminals to grounded shunt caps via bond wires.

14 Claims, 3 Drawing Sheets

GAIN AND BANDWIDTH ENHANCEMENT FOR RF POWER AMPLIFIER PACKAGE

BACKGROUND OF THE INVENTION

1. Field of the Invention

The present invention pertains generally to the field of radio frequency (RF) power transistor devices and, more particularly, to gain and stability aspects of high power, high frequency RF power amplifier circuits.

2. Background

The use of RF power transistor devices as signal amplifiers in wireless communication applications is well known. With the considerable recent growth in the demand for wireless services, such as personal communication services, the operating frequency of wireless networks has increased dramatically and is now well into the gigahertz frequencies. At such high frequencies, laterally diffused, metal oxide semiconductor (LDMOS) transistors have been preferred for power amplification applications, e.g., for use in antenna base stations.

A typical power amplifier package employs paralleled LDMOS transistors formed on one or more dies, which is attached to a package substrate serving as both a heat sink and common ground element. Input (gate) and output (drain) package terminals, which are electrically isolated from the package, are connected to respective input and output terminals on the one or more die by many bond wires. Due to the very low input impedance of the LDMOS power transistors at high frequencies, the bond wires used to connect the package leads to the die cause a relatively significant impedance transformation. At times, this transformation is more than desired.

One early solution to this problem involved implementing multiple transformations from the die to the package leads, such as the coupling circuit described in U.S. Pat. No. 3,441,865 to Siwko. In devices using multiple transformations, however, a significant portion of the transformation occurs on the connecting device, which results in increased loss and bandwidth shrinkage.

Another approach to this problem is to use a parallel resonance matching circuit, as described in U.S. Pat. No. 5,315,265 to Wisherd et al. This method involves adding an inductor in parallel with each of the input and output common-source capacitances of a RF power amplifier. However, this method also suffers from problems of earlier solutions, including bandwidth shrinkage, because the transformation is done away from the power amplifier package.

SUMMARY OF THE INVENTION

In accordance with a main aspect of the invention, gain and bandwidth enhancement is effected by connecting a shunt inductance across the input, as well as the output (i.e., common element) terminals of a power transistor. The shunt inductance is chosen to be the conjugate of the common-source input capacitance of the transistor. In accordance with another aspect of the invention, a similar conjugate matching output circuit is provided to couple the power transistor's common-source output capacitance to a load.

In one embodiment, gain and bandwidth enhancement of an LDMOS power amplifier is implemented by electrically connecting respective gate and drain terminals of the LDMOS transistor to grounded shunt caps via bond wires, the bond wires having an inductance chosen to be the conjugate of the common-source input and output capacitances of the transistor.

Other aspects and features of the present invention will become apparent from consideration of the following description taken in conjunction with the accompanying drawings.

BRIEF DESCRIPTION OF THE DRAWINGS

Preferred embodiments are illustrated by way of example, and not by way of limitation, in the figures of the accompanying drawings, in which like reference numerals refer to like components, and in which.

DETAILED DESCRIPTION OF THE PREFERRED EMBODIMENTS

Figure 1:
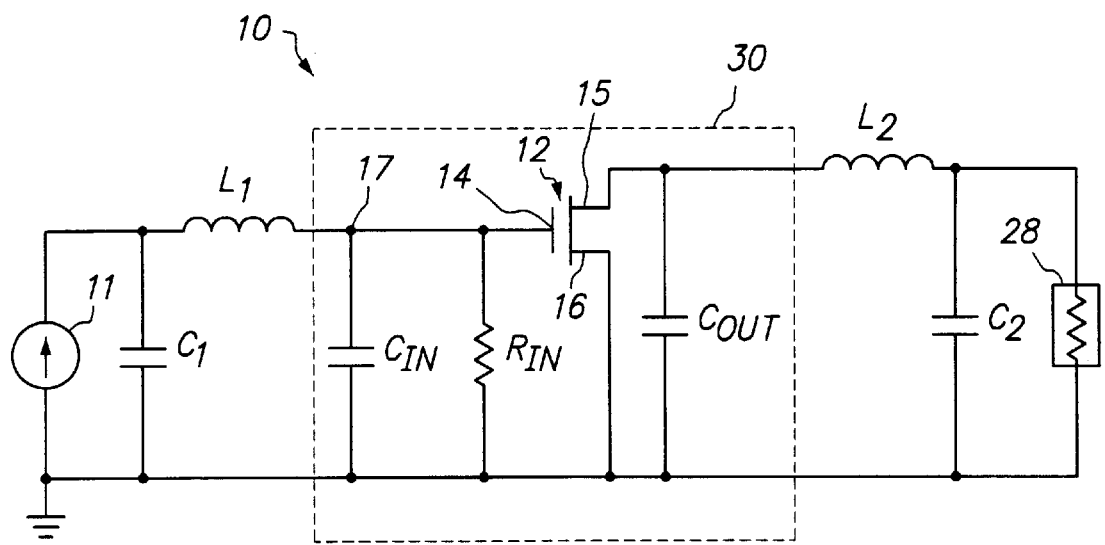
FIG. 1 is a schematic diagram of a conventional matching circuit for a RF power amplifier.

By way of illustration, FIG. 1 shows an exemplary prior art circuit 10 in which a RF signal source 11, typically having a fifty ohm impedance, is amplified by a power transistor 12 and drives a load 28. The power transistor 12 has an input terminal 14, an output terminal 15 and a common element terminal 16. The power transistor 12 may be any type of transistor suitable for RF signal amplification, such as a LDMOS transistor. A series inductor, $L_1$, connects the signal source 11 to the gate terminal 14 of the power transistor 12. Further, the transistor 14 is modeled having a common-source input capacitance, $C_{IN}$, a common-source output capacitance, $C_{OUT}$, and an input resistance, $R_{IN}$.

Figure 2:
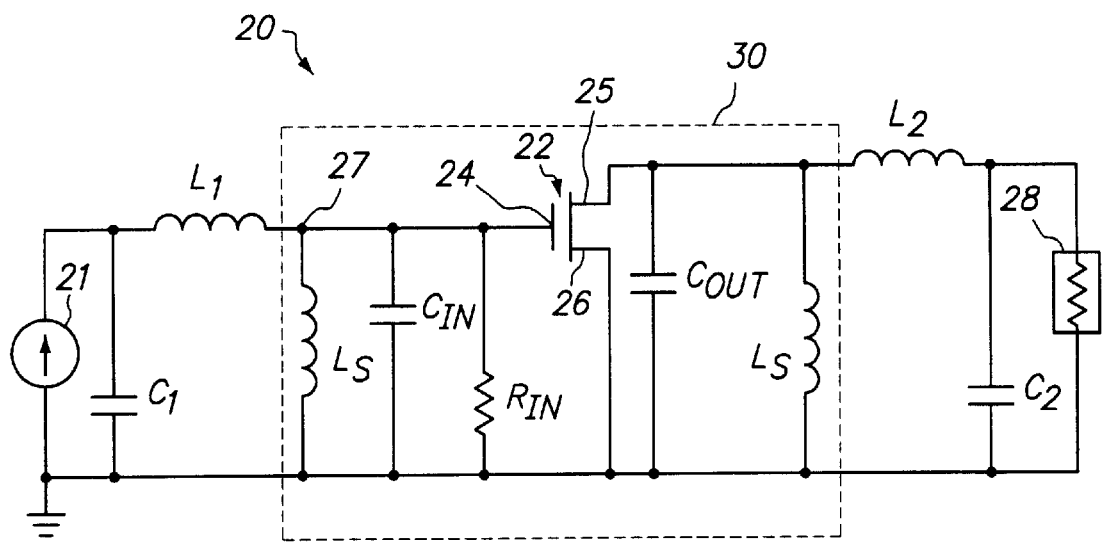
FIG. 2 is a schematic diagram of a matching network for a LDMOS RF power amplifier in accordance with one embodiment of the present invention.

FIG. 2 shows a schematic of a circuit 20 for a RF power amplifier package in accordance with the present invention. This circuit 20 is similar to the circuit 10 of FIG. 1. Circuit 20 further includes a shunt inductor, $L_S$, coupling the input terminal 24 and the common element terminal 26 of the power transistor 22. As explained in greater detail herein, the shunt inductor, $L_S$, is implemented on the package 30, which is depicted on the schematics of FIGS. 1 and 2 by a dashed line. The value of the shunt inductance, $L_S$, is chosen so that its reactance is the conjugate of the reactance of the transistor's common-input capacitance. Preferably, the circuit 20 also includes a shunt inductor, $L_S$, that couples the output terminal 25 and the common element terminal 26 of the power transistor 22. The value of this shunt inductance, $L_S$, is chosen so that its reactance is the conjugate of the reactance of the transistor's common-output capacitance.

When the circuits of FIGS. 1 and 2 are compared, it will become apparent to one of ordinary skill in the art that the circuit 10 of FIG. 1—a standard impedance matching network—has significant loss and decreased bandwidth compared to the circuit 20 of FIG. 2. To facilitate such a comparison, exemplary values for the components used in the circuits 10, 20 are given in the following table.

| Circuit | $C_1$ | $L_1$ | $C_{IN}$ | $R_{IN}$ | $L_S$ |
|---|---|---|---|---|---|
| FIG. 1 | 25.53 pF | 0.246 nH | 167.2 pF | 0.092 ohm | N/A |
| FIG. 2 | 7.113 pF | 0.755 nH | 167.2 pF | 0.092 ohm | 0.035 nH |

(Reference: Vincent F. Perna, "How to Calculate Required Capacitor Q From Desired Matching Network Efficiency or Loss", The RF Capacitor Handbook, American Technical Ceramics, 1994).

If the voltage transfer efficiency of a tank circuit is given by:

$$\text{Eff (voltage)} = [1-(Q_L/Q_U)]$$

then $$\text{Loss(dB)} = 20*\log[Q_U/(Q_U-Q_L)]$$

where $Q_L$ is the loaded Q and $Q_U$ is the unloaded Q of the circuit. Further, it can be shown that $Q_U$ for each circuit is one-hundred fifty ohm and that $Q_L$ can be calculated by:

$$Q_L = [R_P/R_S - 1]^{1/2}$$

where $R_P$, is a typical fifty ohm RF signal source 11, 21 and $R_S$, is the input resistance as seen at the terminal 17, 27. The following table shows the losses calculated according to these equations for the circuits 10, 20.

| Circuit | $R_P$ | $R_S$ | $Q_U$ | $Q_L$ | Loss |
|---|---|---|---|---|---|
| FIG. 1 | 50 ohm | 0.092 ohm | 150 | 23 | 1.5 dB |
| FIG. 2 | 50 ohm | 2.8 ohm | 150 | 4.1 | 0.24 dB |

It is apparent from these calculations that the bandwidth can be greatly increased if the unloaded Q of the components and the impedance transformation are considered. For example, since the bandwidth is determined by $f_o/Q_L$, the bandwidth of circuit 20 is much greater than the bandwidth of circuit 10. Also, circuit 20 has decreased loss and improved efficiency compared to circuit 10.

While the analysis above focuses on a matching network at the input of the power amplifier package 30, it should be appreciated that a shunt inductor can similarly be implemented at the output. As derived for the input transformation, it should be appreciated that connecting a conjugate element between the output and the common element terminals would likewise negate the reactive component, causing the real part of the impedance to increase and the imaginary portion to approach zero. Therefore, a shunt inductor may be used to effect a transformation between the output of the power amplifier package 30 and a load 28, as described for the input and the RF signal source 21.

As explained, the values of the shunt inductances, $L_S$, are chosen so that their reactances are the conjugate of the reactances of the transistor's common-input and common-output capacitances. By connecting these conjugate elements across the common-input and common-output capacitances, the reactive components are negated, which causes the real part of the impedance to increase and the imaginary portion to approach zero. With this accomplished, connecting to and from the power amplifier package represents a lesser transformation.

Figure 3:
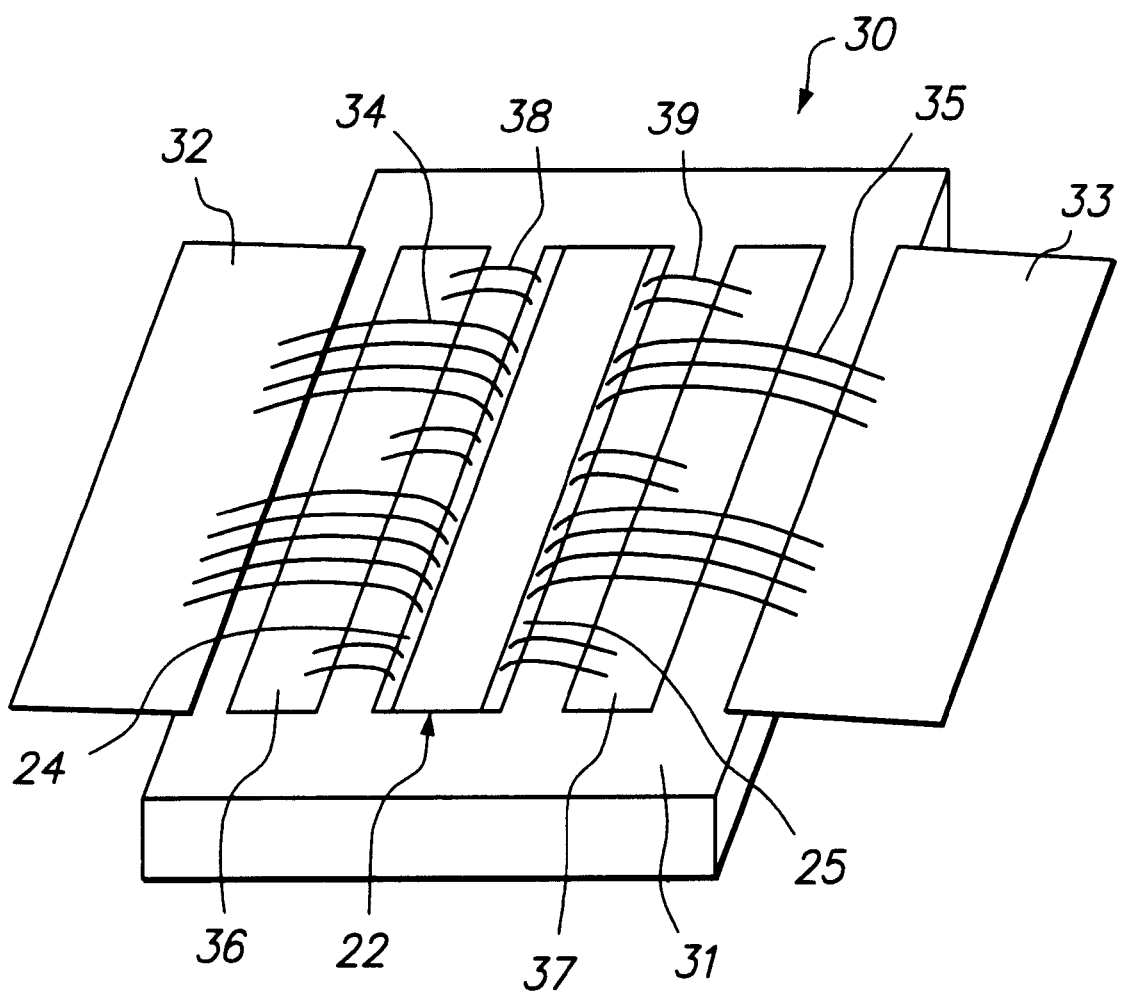
FIG. 3 is a physical view of a LDMOS power amplifier package implementing the circuit of FIG. 2.

FIG. 3 shows a power amplifier package 30 implementing the circuit 20 of FIG. 2. The package 30 comprises a substrate 31 having deposited on it the RF power transistor 22. Also shown is an input lead 32 and an output lead 33, coupled to the respective input terminal 24 and output terminal 25 of the power transistor 22 by bond wires 34 and 35, respectively. The bond wires 34 that connect the input lead 32 to the input terminal 24 of the power transistor 22 correspond to the series inductor, $L_1$, in FIG. 2. The bond wires 35 that connect the output lead 33 to the output terminal 25 of the power transistor 22 correspond to the series inductor, $L_2$, in FIG. 2. Therefore, it is possible to tune $L_1$ and $L_2$ by changing the number and configuration of bond wires 34 and 35.

Also deposited on the substrate 31 are shunt caps 36, 37, which are connected to a (grounded) common element terminal (in this case, substrate 31) of the power amplifier package 30. Bond wires 38 connect the input terminal 24 of the power transistor 22 to shunt cap 36, effectively coupling the input terminal 24 to the common element terminal 31 with a shunt inductance, $L_S$. Preferably, another set of bond wires 39 connect the output terminal 25 of the power transistor 22 to shunt cap 37, effectively coupling the output terminal 25 to the common element terminal 31 with a shunt inductance, $L_S$. Bond wires 38, 39 correspond to the shunt inductors, $L_S$, in FIG. 2. As with $L_1$ and $L_2$, it is possible to tune $L_S$ by changing the number and configuration of bond wires 38, 39, and the shunt inductors, $L_S$, need not be the same.

As explained, the shunt inductors, $L_S$, of circuit 20 are implemented on the substrate 31 by bond wires 38, 39. Because the shunt inductors, $L_S$, are implemented on the substrate 31, rather than away from it, increased gain and bandwidth are achieved, as shown in the analysis above.

Figure 4:
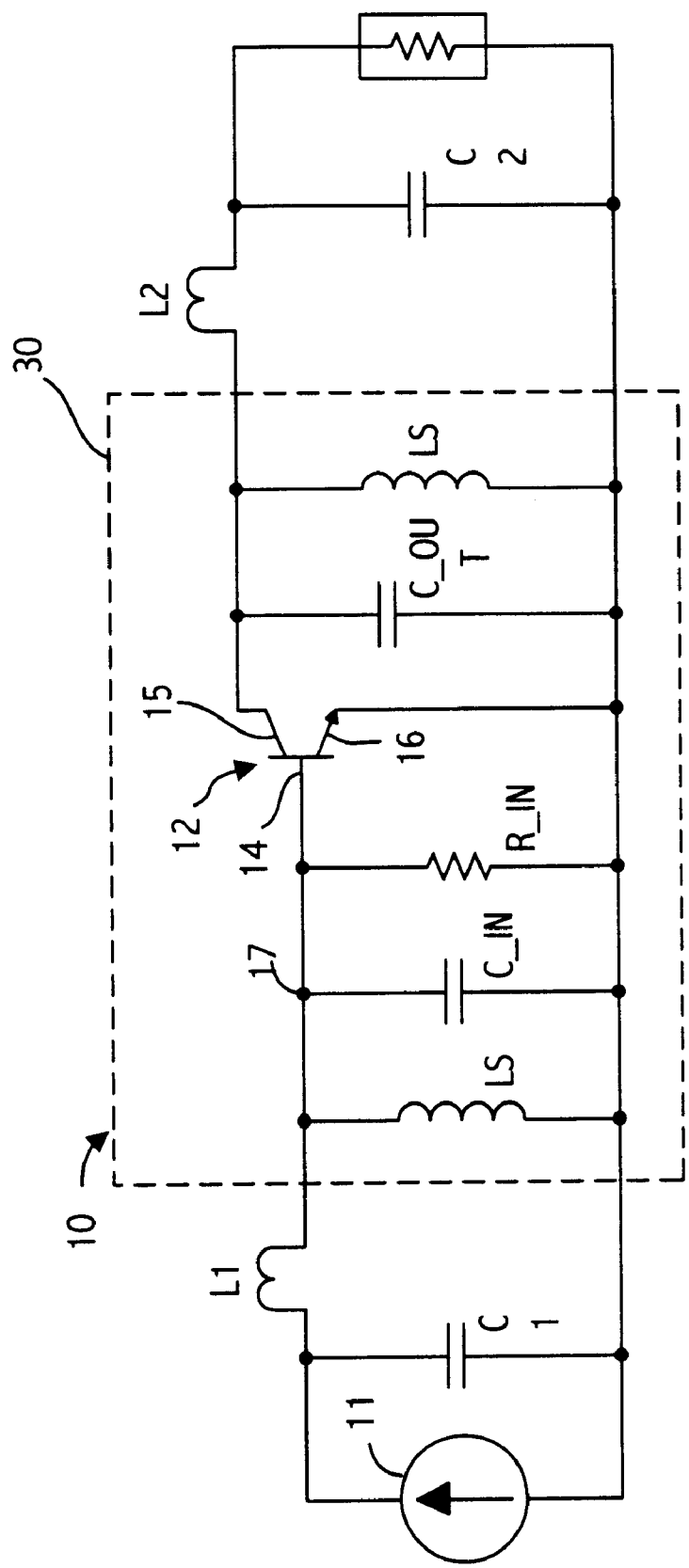
FIG. 4 is a schematic diagram of a matching network for a bipolar junction transistor RF power amplifier in accordance with another embodiment of the present invention.

Preferably, a LDMOS power transistor is used in the power amplifier; however, the inventive concepts contained herein may be applied to other types of power transistors. For example, a shunt inductor may be used with bipolar junction transistors (BJTs), as illustrated in FIG. 4. A shunt inductor may also be used with gallium arsenide (GaAs) FETs, and other heterojunction structures.

While preferred embodiments and applications have been shown and described, as can be appreciated by those of ordinary skill in the art, the invention can be embodied in other specific forms without departing from the inventive concepts contained herein. The presently disclosed embodiments, therefore, should be considered as illustrative, not restrictive. Accordingly, the invention should not be limited except by the scope of the appended claims and their equivalents.

What is claimed is:

1. A RF power amplifier circuit, comprising;
   a transistor having an input terminal, an output terminal and a common element terminal, and further having a common-input capacitance and a common-output capacitance; and
   an input circuit configured for receiving a RF signal from a RF signal source and for electrically coupling the RF signal source across the respective input and common element terminals of the transistor, the input circuit comprising a first input inductor for coupling the RF signal source to the input terminal and a second input inductor coupling the input terminal to the common element terminal, the input circuit substantially matching an impedance of the RF signal source to both a resistive component and a capacitive reactance of the transistor input,
   wherein the second input inductor is chosen so that its reactance is substantially the conjugate of the reactance of the common-input capacitance.

2. The power amplifier of claim 1, further comprising an output circuit configured for electrically coupling a load across the respective output and common element terminals of the transistor, the output circuit comprising a first output inductor adapted to couple the load to the output terminal and a second output inductor coupling the output terminal to the common element terminal, wherein the second output inductor is chosen so that its reactance is substantially the conjugate of the reactance of the common-output capacitance.

3. The power amplifier of claim 1, wherein the transistor comprises a LDMOS transistor.

4. The power amplifier of claim 1, wherein the transistor comprises a bipolar junction transistor.

5. The power amplifier of claim 1, wherein the second input inductor comprises one or more bond wires.

6. The power amplifier of claim 2, wherein the second output inductor comprises one or more bond wires.

7. The power amplifier of claim 1, wherein the value of the second input inductor is determined by the length and number of bond wires.

8. The power amplifier of claim 2, wherein the value of the second output inductor is determined by the length and number of bond wires.

9. A RF power amplifier package comprising:

a substrate;

a transistor disposed on the substrate, the transistor having an input terminal, an output terminal and a common element terminal, and further having a common-input capacitance and a common-output capacitance;

an input lead;

one or more input bond wires coupling the input lead to the input terminal of the transistor; and one or more input shunt bond wires coupling the input terminal to the common element terminal, the one or more input shunt bond wires having a reactance that is substantially the conjugate of the reactance of the common-input capacitance.

10. The RF power amplifier package of claim 9, further comprising an input shunt cap disposed on the substrate and connected to a reference ground, wherein the one or more input bond wires couple the input terminal of the transistor to the input shunt cap.

11. The RF power amplifier package of claim 9, further comprising:

an output lead;

one or more output bond wires coupling the output lead to the output terminal of the transistor; and one or more output shunt bond wires coupling the output terminal to the common element terminal, the one or more output shunt bond wires having a reactance that is substantially the conjugate of the reactance of the common-output capacitance.

12. The RF power amplifier package of claim 11, further comprising an output shunt cap disposed on the substrate and connected to an electrical ground, wherein the one or more output bond wires couple the output terminal of the transistor to the output shunt cap.

13. The RF power amplifier package of claim 9, wherein the transistor comprises a LDMOS transistor.

14. The RF power amplifier package of claim 9, wherein the transistor comprises a bipolar junction transistor.

* * * * *